United States Patent [19]
Schmitt

[11] Patent Number: 6,098,964
[45] Date of Patent: Aug. 8, 2000

[54] METHOD AND APPARATUS FOR MONITORING THE CONDITION OF A VAPORIZER FOR GENERATING LIQUID CHEMICAL VAPOR

[75] Inventor: John V. Schmitt, Sunnyvale, Calif.

[73] Assignee: Applied Materials, Inc., Santa Clara, Calif.

[21] Appl. No.: 08/928,371

[22] Filed: Sep. 12, 1997

[51] Int. Cl.$^7$ ................................................ B01F 3/04
[52] U.S. Cl. ........................................ 261/75; 118/726
[58] Field of Search .................. 118/726; 261/119.1, 261/121.1, 75, 78.1

[56] References Cited

U.S. PATENT DOCUMENTS

| | | | |
|---|---|---|---|
| 4,436,674 | 3/1984 | McMenamin | 261/64 B |
| 4,553,431 | 11/1985 | Nicolai . | |
| 4,783,343 | 11/1988 | Sato | 427/8 |
| 5,204,314 | 4/1993 | Kirlin | 505/1 |
| 5,362,328 | 11/1994 | Gardiner | 118/726 |
| 5,535,624 | 7/1996 | Lehmann . | |
| 5,760,294 | 6/1998 | Lehmann . | |

FOREIGN PATENT DOCUMENTS

| | | |
|---|---|---|
| 0286158 | 3/1988 | European Pat. Off. . |
| 0460511 | 5/1991 | European Pat. Off. . |
| 3206130 | 2/1983 | Germany . |
| 3929506 | 9/1989 | Germany . |
| 0689038 | 6/1995 | Germany . |
| 02111518 | 4/1990 | Japan . |

OTHER PUBLICATIONS

Search Report issued on Dec. 21, 1998 in PCT/US98/17742.
Ossart, et al, Effect of Metal–Organic Composition Fluctuation on the Atmospheric–Pressure Metal–Organic Vapor Phase Epitaxy Growth of GaAlAs/GaAs/InP Structures; J.J.App.Phys., vol. 30, No. 5A, May 1991, pp. L783–L785.
Kondah & Ohta, Chemical vapor deposition of aluminum from dimethylaluminumhydride (DMAH): Characteristice of DMAH vaporizati and Al growth kinetics; J.Vac-.Sci.Technol.A 13(6) Nov./Dec. 1995.
U.S. application No. 09/064,401 (Atty. Dkt. 1515/PVD/DV).
Jun. 30, 1998 Declaration of John V. Schmitt.
U.S. application No. 08/870,961, filed Jun. 6, 1997 (Atty. Dk. #1688/PVD/DV).
U.S. application No. 08/922,510, filed Sep. 3, 1997 (Atty. Dk. #2036/PVD/DV).

*Primary Examiner*—Richard Bueker
*Attorney, Agent, or Firm*—Benjamin Glenn

[57] ABSTRACT

In a method and apparatus for producing a vapor which serves as a chemical processing material by delivering a carrier gas and a reactive liquid to a vaporizer in which the vapor is produced, the operating state of the vaporizer is monitored by measuring the pressure of the carrier gas being delivered to the vaporizer and producing a detectable indication when the measured pressure exceeds a given value.

6 Claims, 2 Drawing Sheets

METHOD AND APPARATUS FOR MONITORING THE CONDITION OF A VAPORIZER FOR GENERATING LIQUID CHEMICAL VAPOR

BACKGROUND OF THE INVENTION

The present invention relates to industrial chemical processes in which a processing chemical initially in the form of a liquid is converted to the vapor state, in which state it is conveyed to a processing station.

In many industrial chemical processes, a processing chemical is stored in a container in a liquid state and the supply of processing chemical in the container is gradually exhausted as the liquid is converted to a vapor and expelled from the container. According to one technique currently employed for converting such a processing chemical to a vapor, a fill gas is introduced into the container via an inlet opening at the top of the container. This fill gas creates a high pressure region above the processing chemical. The container is also provided with an outlet line having an outlet pipe which is immersed in the processing chemical and which leads, via a filter and appropriate valves, to a flow control device, such as a liquid mass flow controller. The flow control device delivers the processing chemical to a vaporizer, together with a carrier gas. Within the vaporizer, the carrier gas mixes with the processing chemical to produce a vapor which is then delivered to the processing station. The processing station may be composed of a process chamber whose interior is maintained at a low pressure that acts to draw the vapor from the vaporizer.

In apparatus of the type described above, the vaporizer normally contains orifices of very small size, in the range of 0.001 to 0.030 inch in diameter. These orifices can be easily clogged. Although it is common practice to dispose a filter in the flow path which conveys the processing chemical to the vaporizer, and such a filter effectively prevents particles already present in the processing chemical from reaching the vaporizer, the vaporizer is nevertheless subject to clogging as a result of thermal decomposition of the processing chemical in the vaporizer. The resulting thermal decomposition products will often plate the orifices in the vaporizer, resulting in clogging of those orifices. Such thermal decomposition may occur when all operating conditions are within their normal range, but will occur at an increased rate if the temperature within the vaporizer is outside of a desired range.

Eventually, the vaporizer can become clogged to such a degree that an acceptable vapor flow is no longer being produced. However, when an unacceptably low vapor flow rate is first noted, the source of the problem may not be immediately apparent. For example, the problem may be caused by a failure or a blockage of any component in the vapor delivery system or the processing chemical delivery system. Therefore, when such a decrease in the vapor flow rate has been observed, the system often must be shut down, typically for many hours, to allow the source of the problem to be identified, and the necessary repair or replacement to be made.

If it is found that the problem is caused by vaporizer clogging, it is usually necessary to undertake a long and complicated process to properly cool down and purge the lines associated with the vaporizer in order to avoid creation of conditions which could be hazardous to the operating personnel and in order to prevent additional contamination of the hardware. The resulting apparatus downtime will, of course, have an adverse effect on production throughput.

A number of techniques for monitoring the operating condition of a vaporizer in such apparatus have been proposed and used in practice. Each of these techniques possesses certain inherent disadvantages.

One such technique involves sensing of the vapor pressure downstream of the vaporizer. If this pressure drops, it could be the result of vaporizer clogging. However, this approach typically requires that a pressure sensor be placed in contact with the reactive vapor. Exposure to the reactive vapor can be corrosive to the sensor components. Furthermore, it may be necessary to heat the sensor, which can reduce its operating life. In addition, in order for the sensor to properly monitor the downstream vapor pressure, it often must be located in such a manner that it can have an adverse effect on the fluid conductance in the vapor flow path. If the fluid flow conductance is reduced, the result can be lower deposition rates. Furthermore, such sensors can introduce dead-legs which are in communication with the vapor flow path. The presence of dead-legs leads usually complicates purging resulting in prolonged purge cycles during line maintenance.

In apparatus of the type here under consideration, the carrier gas is typically delivered to the vaporizer by a mass flow controller. The operation of such a controller can be monitored and a detected controller fault condition may be due to severe blockage downstream of the controller. However, it is often the case that only a severe blockage downstream of the controller can be relied upon to produce a fault indication since the controller itself operates in a manner to compensate for partial obstructions. In addition, faults occurring within the controllers themselves are all too frequent, whether or not the vaporizer is obstructed. Therefore, monitoring of the controller status usually does not provide a particularly useful indication of vaporizer problems.

Similarly, it is known to monitor the liquid mass flow controller which is delivering processing chemical to the vaporizer. Here again, if an indication of a liquid mass flow controller fault is due to blockage of the vaporizer, such indication often will not be produced until a severe blockage has occurred. In addition, an indication of a liquid mass flow controller fault can be due to a number of other causes, including filter clogging. Therefore, monitoring of liquid mass flow controller faults to identify vaporizer clogging has drawbacks similar to those of monitoring the carrier gas mass flow controller.

When the vapor is delivered to a processing station in order to form a layer, or film, on a workpiece, or substrate, inspection of the resulting film can provide an indication of whether vapor has been delivered to the processing station at the desired rate. Thus, although the vaporizer may be only partially clogged, some property, such as thickness, of the resulting film can be outside of specifications. However, such film defect can be due to a number of causes and therefore often does not allow vaporizer clogging to be pinpointed with any degree of reliability. Furthermore, because each semiconductor substrate can be worth tens of thousands of dollars, it is highly desirable to detect vaporizer clogging before a substrate is ruined.

BRIEF SUMMARY OF THE INVENTION

It is an object of the present invention to more effectively monitor the operating state of a vaporizer in apparatus of the type described above.

A more specific object is to perform such monitoring in a simple and reliable manner.

A further specific object of the invention is to provide an indication of the degree of clogging of flow passages in the vaporizer.

An additional specific object of the invention is to provide an indication when the rate at which vapor is being generated by the vaporizer falls below an acceptable value.

The above and other objects are achieved, according to the present invention, in a method and apparatus for producing a vapor which serves as a chemical processing material, which method includes delivering a carrier gas and a reactive liquid to a vaporizer in which the vapor is produced, by an operation of monitoring the operating state of the vaporizer by the steps of measuring the pressure of the carrier gas being delivered to the vaporizer and producing a detectable indication when the measured pressure exceeds a given value.

The given value can be that at which the vaporizer is no longer producing vapor at an acceptable rate. In addition, the indication can be obtained at regular time intervals to provide an indication of the rate of increase of the pressure of carrier gas being delivered to the vaporizer. This information can, in turn, serve as a diagnostic parameter which indicates, or contributes to an indication, that some operating condition does not have its desired value.

For example, thermal decomposition of the liquid chemical reactant may not occur, or may occur at a very low rate, if the liquid reactant and the resulting vapor are being maintained at proper temperatures. Therefore, if the carrier gas pressure is rising, or is rising at more than an expected rate, this can provide an indication that a temperature controller within the apparatus is not maintaining the desired temperature.

In addition, if progressive clogging of the vaporizer is inevitable in a particular process, the carrier gas pressure indications can allow prediction of the time at which the system should be shut down for appropriate maintenance or replacement of the vaporizer in advance of deterioration of the process results beyond on acceptable limit.

DETAILED DESCRIPTION OF THE INVENTION

Figure 1:
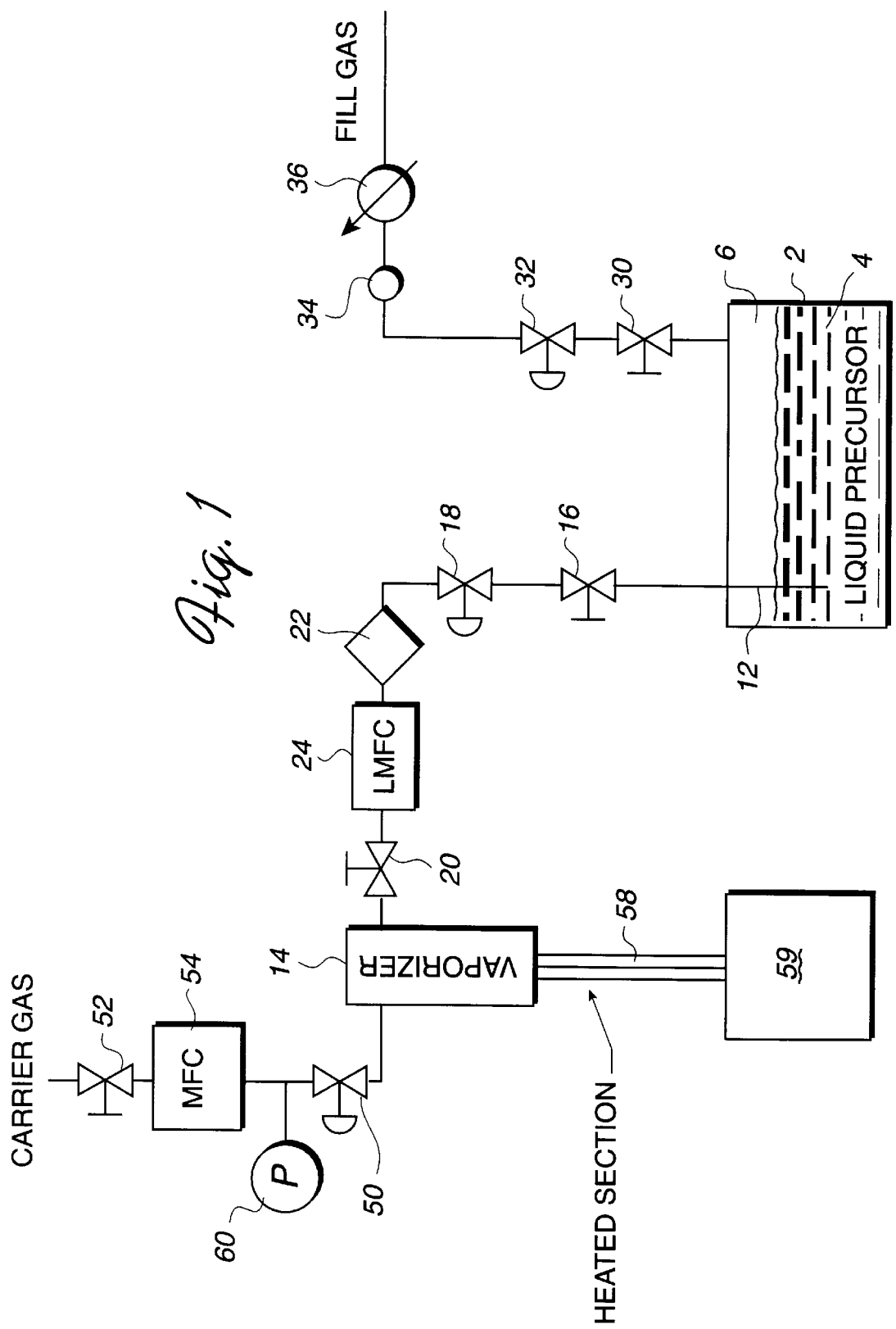
FIG. 1 is a schematic diagram of one embodiment of apparatus including a pressure sensor according to the present invention.

FIG. 1 is a block diagram illustrating a portion of conventional apparatus supplemented by a pressure sensor used in accordance with the present invention. This apparatus includes a container 2, of a type commonly referred to as an ampule, which is a sealed container containing a quantity of a chemical reactant 4 in the liquid state. The upper portion of the interior of container 2 defines a head space 6 which is coupled, via an inlet opening in the lid, or top wall, of container 2, to an inlet line containing a valve 30. The inlet line will be connected to conduct a fill gas which is introduced into head space 2 in order to place liquid 4 under pressure. An outlet pipe 12 extends into container 6 via an outlet port located in the top wall of container 2. Pipe 12 has an inlet end which is immersed in liquid 4, typically at a level close to the bottom of container 2. Liquid chemical substance 4 is delivered to a vaporizer 14 via a flow path which includes pipe 12, valves 16, 18 and 20, a particulate filter 22 and a liquid mass flow controller 24.

An inlet line in the top wall of container 2 is connected to a fill gas flow path which includes valves 30 and 32, a one-way valve 34 and a regulator 36. Fill gas is supplied to head space 6 via this flow line.

A carrier gas is also delivered to vaporizer 14 via a flow path which includes two control valves 50 and 52 and a mass flow controller 54. Within vaporizer 14, the carrier gas is mixed with the liquid chemical reactant and the mixture is conducted to a heated section 58. A vapor composed of the carrier gas-liquid chemical mixture is formed in vaporizer 42 and heated section 58. The resulting vapor is then delivered to a process chamber 59.

The apparatus shown in FIG. 1 can form part of, for example, a chemical vapor deposition system which uses, as the liquid chemical reactant 4, a product such as that sold under the trade name Cupraselect and, as the carrier gas, for example, helium. A vapor containing this chemical is delivered, from vaporizer 14 and heated section 58, to a chemical vapor deposition chamber 59 where a layer, or film, of copper is deposited on a substrate such as a semiconductor wafer. An exemplary process chamber 59, known in the prior art, to which the vapor may be supplied is of a type which includes a vapor deflection plate and a perforated plate, or "shower head", through which the vapor is introduced into the chamber.

All of the apparatus described thus far is conventional in the art.

According to the present invention, this apparatus is supplemented by a pressure sensor 60 connected in the carrier gas flow path between mass flow controller 54 and vaporizer 14. As explained in greater detail below, by monitoring the pressure of the carrier gas flow to the vaporizer 14, clogs developing in the vaporizer 14 may be detected and appropriate actions taken to reduce system downtime and reduce workpiece spoilage. While, in the illustrated embodiment, pressure sensor 60 is connected between flow controller 54 and valve 50, sensor 60 can just as well be connected between valve 50 and vaporizer 14. However, it is preferred that pressure sensor 60 be connected downstream of the outlet of mass flow controller 54 and upstream of vaporizer 14.

When the apparatus shown in FIG. 1 is first placed into operation, with all of the components, including vaporizer 14 and heated section 58, free of any deposits in their flow paths, and carrier gas and liquid chemical reactant are supplied to vaporizer 14 at selected flow rates, the pressure measured by pressure sensor 60 will have a first value. However, as the flow resistance of the path along which vapor flows in vaporizer 14 and heated section 58 increases, due essentially to deposits of products resulting from decomposition of the liquid chemical reactant, the pressure measured by pressure sensor 60 will gradually increase. This increase will be accentuated by the fact that mass flow controller 54 tends to maintain a constant rate of mass flow of the carrier gas. As a result, the measured pressure will increase as a nonlinear, increasing function of vaporizer flow path flow resistance increase, i.e. the pressure increase will become more apparent as vaporizer clogging becomes more severe.

The apparatus can be operated in an initial test mode in which the pressure value read by sensor 60 is monitored together with direct measurement of the rate of delivery of vapor to the process chamber. Direct measurement of the rate of flow of vapor will typically not be feasible or practical during normal chemical processing operations in which the processing chemical corrodes or coats surfaces of the measuring device which are exposed to the vapor. However, during the relatively short time period when the apparatus is operated in an initial test mode, such a measuring device can perform satisfactorily for many types of processes. When direct measurement of the rate of flow of vapor indicates that this rate has become unacceptably low due to increased resistance to the flow of vapor, the value of the pressure being concurrently detected by pressure sensor 60 is identified as the maximum acceptable pressure value and the difference between the maximum acceptable pressure value and the initially measured pressure value is identified as the maximum permissible pressure increase.

During this initial test operation, the time rate of change in the pressure detected by pressure sensor 60 can also be monitored and recorded. All other operating conditions, including, in particular, the temperature within the vapor flow path in vaporizer 14 and heater section 58 are monitored and controlled to assure that they remain within desired limits. The rate of change in the carrier gas pressure can then be determined on the basis of the pressure values measured at fixed intervals and the resulting rate of change values can be stored as the expected, or normal, time rate of carrier gas pressure change from an operating state when the pressure detected by sensor 60 has its desired value to the time at which this pressure has its maximum acceptable value.

The resulting measured values for the maximum acceptable pressure and/or the maximum acceptable deviation from the desired pressure value and the normal time rate of pressure change can then be used as reference values for analyzing the measured pressure value and the corresponding time rate of pressure change values during subsequent operating cycles.

In the test operating cycle, a number of sensors, such as temperature sensors, may be installed, which sensors can be removed at the end of the test operating cycle. Then, during subsequent normal operating cycles, if the maximum acceptable pressure level or the maximum deviation from the desired pressure value is reached, an alarm signal can be generated to alert operators to halt operation of the apparatus, or a control signal which automatically halts apparatus operation can be produced.

The time rate of measured pressure change, or the differential between that rate and the nominal time rate of measured pressure change, can be used to alert operators to a possible fault condition. For example, if the time rate of measured pressure change is greater than the nominal time rate, this may alert the operators to verify correct operation of the devices for controlling the temperatures within the vaporizer.

Finally, the pressure change and time rate of pressure change can be monitored to aid in planning the time of system shut down for maintenance. Thus, maintenance of the vaporizer can be scheduled to occur not only prior to the increased carrier gas pressure (and hence reduced vapor flow rate) reaching unacceptable levels, but also to coincide with other required system maintenance so that system downtime can be minimized.

Figure 2:
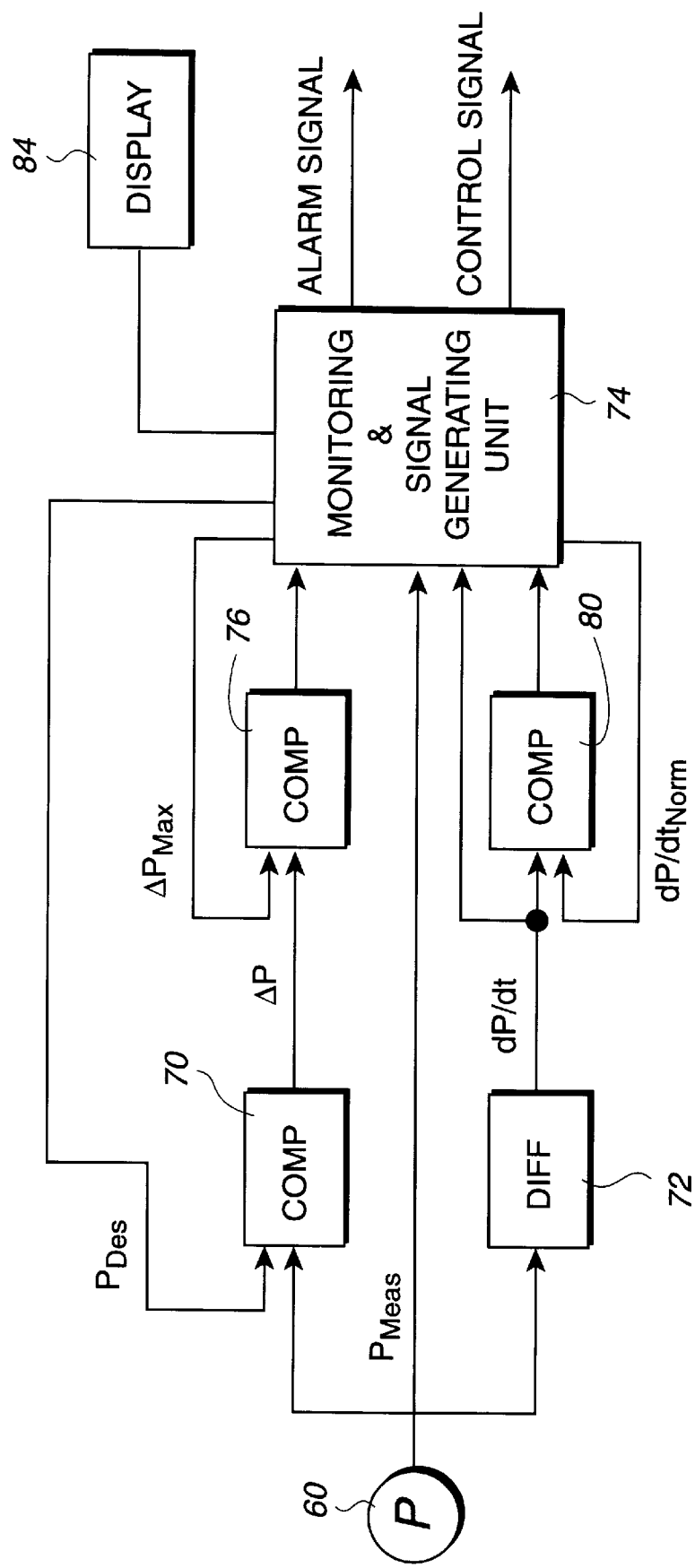
FIG. 2 is a block circuit diagram of one embodiment of a monitoring and indication system according to the present invention.

One exemplary embodiment of a monitoring, calculating and signal generating system which may be used to practice the present invention is shown in FIG. 2. The system illustrated is a dedicated system specifically constructed to produce appropriate alarm and control signals. The system may be implemented in analog form or in digital form, in which case appropriate analog/digital and digital/analog converters would be provided in a manner well-known in the art. However, it should be readily apparent that a system according to the invention can also be implemented by appropriate programming of any general purpose computer. The embodiment illustrated is given only by way of non-limiting example and many other circuit configurations could be provided. Once one skilled in the art understands the basic concept of relating measured carrier gas pressure values and calculated time rate of pressure change values, such a person would have no difficulty in designing and constructing a suitable monitoring and control system.

In the system shown in FIG. 2, pressure sensor 60 produces an output signal, $P_{Meas}$, representing the value of the gas pressure currently being monitored. This pressure signal is delivered to a first signal amplitude comparator 70, a time differentiator 72 and a monitoring and signal generating unit 74. Successive values of this signal, $P_{Meas}$, may be stored in unit 74. The output signal from differentiator 72, representing dP/dt, is also supplied to unit 74, where successive measured values may be stored. These two signals will be employed during an initial test operation cycle to derive values for the carrier gas pressure that should exist when the apparatus is first placed in operation, the value of this pressure being designated $P_{Des}$, as well as the maximum acceptable increase in that pressure value, this maximum acceptable value being designated $\Delta P_{Max}$, and the normal time rate of change of the pressure value, this normal change being designated $dP/dt_{Norm}$. The value for $dP/dt_{Norm}$ is derived while auxiliary measurements are performed during the test operation cycle to verify that all other system conditions are within normal ranges.

The value of $P_{Meas}$ at the start of the test operation cycle is stored in unit 74 as the desired pressure value, $P_{Des}$. The difference between $P_{Des}$ and the maximum acceptable pressure value is stored in unit 74 as $\Delta P_{Max}$. The measured value for dP/dt is stored in unit 74 as the normal time rate of change of value, $dP/dt_{Norm}$.

Thereafter, during a normal industrial operation cycle, the pressure signal produced by sensor 60 is compared in comparator 70 with $P_{Des}$ to produce a pressure difference signal, $\Delta P$, which signal is supplied to a further comparator 76 where it is compared with the maximum permissible pressure differential, $\Delta P_{Max}$. Comparator 76 may be constructed to supply to unit 74 either a signal representing the difference between the signals at its two inputs or a trigger signal when $\Delta P$ equals or exceeds $\Delta P_{Max}$.

The rate of time variation signal produced by differentiator 72 is supplied to a further comparator 80, where it is compared with the stored value of $dP/dt_{Norm}$. Comparator 80 may be constructed to produce an output signal representing the difference between the signals at its two inputs or an output signal only when the currently calculated time differential value exceeds the stored, normal, time differential value.

In a simple embodiment according to the present invention, unit 74 can be constructed to produce an alarm signal and/or a control signal wherever the output of comparator 76 indicates that $\Delta P$ has equaled or exceeded $\Delta P_{Max}$. In a similar manner, the unit 74 can produce an appropriate alarm or control signal when the output of comparator 80 indicates that dP/dt has equaled or exceeded $dP/dt_{Norm}$.

The values for all of the other signals supplied to unit 74, i.e. the signals produced by pressure sensor 60, comparators 70, 76 and 80 and differentiator 72 can be supplied to a display 84 along with the reference values generated during the initial test operation cycle. The displayed values can then be consulted by an operator to determine whether the current values of the output signals from sensor 60, comparator 70 and differentiator 72, in comparison with the stored reference signals, is indicating either that some other system operating condition has a value outside of its normal range and/or to allow planning of the next apparatus shutdown for maintenance purposes. If the displayed values indicate the possibility that the value of some other operating condition is outside of its normal limits, appropriate adjustments can be made, possibly with the aid of signals from other sensors, to adjust the value of the deviating operating condition, without shutting down the apparatus. In this way, the period during which operation can proceed may be extended without requiring a shutdown.

There are commercially available pressure sensors that may be used as sensor 60 and that are capable of providing a detectable indication of a pressure change as small as 1 Torr. In accordance with the present invention, it is recognized that in the course of various chemical processes, such as chemical vapor deposition of layers on substrates, a carrier gas pressure change as small as 10 Torr can result in, or be associated with, a noticeable change in the characteristics of the deposited layer. Accordingly, detection of a pressure increase in the flow of carrier gas to the vaporizer, of the order of 2–4 Torr, relative to an initial pressure value, can provide an effective leading indicator of a developing flow resistance increase in the vaporizer or in the vapor flow path from the vaporizer to the interior of the processing chamber. Therefore, the method and apparatus according to the invention encompass embodiments in which a detectable indication of a pressure rise that can constitute such a leading indicator.

While the present invention is particularly applicable to systems of the type described above, in which a carrier gas and liquid chemical are delivered to a small pore vaporizer, i.e. a direct vaporizer system, the monitoring method and apparatus could also be applied to large orifice vaporizers such as bubbler systems in which a carrier gas is bubbled through a body of liquid chemical to produce a vapor. Such a bubbling system is disclosed in my copending U.S. application Ser. No. 08/922,510 filed on Sep. 3, 1997, entitled, "Method And Apparatus For Monitoring Generation of Liquid Chemical Vapor" (Attorney Docket No. 2036 PVD/DV, 7828/PD-5746), the entirety of which is incorporated herein by reference.

While particular embodiments of the present invention have been shown and described, it will be understood by those skilled in the art that changes and modifications may be made without departing from this invention in its broader aspects and, therefore, the aim in the appended claims is to cover all such changes and modifications as fall within the true spirit and scope of this invention.

What is claimed is:

1. A method for producing vapor in a vaporizer having a determined maximum acceptable carrier gas pressure time rate of change for the pressure of the carrier gas provided to the vaporizer, the method comprising the steps of:

(a) flowing a carrier gas through a flow control device and thereafter to a first inlet of a vaporizer;

(b) flowing a processing liquid to a second inlet of said vaporizer whereby the vaporizer outputs a vaporized mixture of said carrier gas and said processing liquid to an outlet of said vaporizer; and, thereafter, (c) measuring periodically the pressure of said carrier gas provided to said vaporizer;

(d) determining a carrier gas pressure time rate of change by comparing a measured carrier gas pressure to a previously measured carrier gas pressure;

(e) comparing said measured carrier gas pressure time rate of change to the maximum acceptable carrier gas pressure time rate of change; and (f) generating a detectable indication when said measured carrier gas pressure time rate of change exceeds said maximum acceptable carrier gas pressure time rate of change.

2. A method according to claim 1 wherein the detectable indication is a control signal.

3. A method according to claim 1 wherein the detectable indication is an alarm signal.

4. A method for producing vapor in a vaporizer, the method comprising the steps of:

periodically measuring the carrier gas pressure provided to a vaporizer during a processing cycle;

determining a time rate of change for the carrier gas pressure; and comparing the time rate of change for the carrier gas pressure to a predetermined acceptable range of carrier gas pressure time rate of change for a carrier gas provided to the vaporizer; and generating a signal if the determined carrier gas pressure time rate of change is outside the predetermined acceptable range of carrier gas pressure time rate of change for a carrier gas provided to the vaporizer.

5. The method according to claim 4 wherein the signal is a control signal.

6. The method according to claim 4 wherein the signal is an alarm signal.

* * * * *